United States Patent [19]

Pepe

[11] 4,326,194
[45] Apr. 20, 1982

[54] DUAL ENCODED SWITCHING MATRIX

[75] Inventor: Russell J. Pepe, Piscataway, N.J.

[73] Assignee: The Singer Company, Stamford, Conn.

[21] Appl. No.: 195,959

[22] Filed: Oct. 10, 1979

Related U.S. Application Data

[63] Continuation-in-part of Ser. No. 30,502, Apr. 16, 1979, abandoned.

[51] Int. Cl.³ ............................................. G06F 3/02
[52] U.S. Cl. ........................... 340/365 R; 200/5 A; 340/365 S; 340/825.79
[58] Field of Search ............ 340/166 R, 365 R, 365 S; 178/17 C; 179/90 K, 18 GF; 200/5 R, 5 A, 6 R; 235/145 R; 112/158 E; 364/707, 709, 710; 400/479

[56] References Cited

U.S. PATENT DOCUMENTS

| | | | |
|---|---|---|---|
| 3,284,773 | 11/1966 | Saykay | 340/365 S |
| 3,761,945 | 9/1973 | Engle | 340/147 T |
| 3,778,815 | 12/1973 | Wright | 340/365 S |
| 3,886,335 | 5/1975 | Hendricks | 200/5 A |
| 3,979,744 | 9/1976 | Schroder | 340/365 R |
| 4,074,261 | 2/1978 | Van Der Gaag | 340/166 R |
| 4,078,257 | 3/1978 | Bagley | 200/5 R |
| 4,148,017 | 4/1979 | Tomisawa | 340/365 S |
| 4,157,539 | 6/1979 | Hunts et al. | 340/365 S |

*Primary Examiner*—James J. Groody
*Attorney, Agent, or Firm*—David L. Davis; Robert E. Smith; Edward L. Bell

[57] ABSTRACT

An input switch arrangement which minimizes the number of connections needed between an array of switch members and the circuit used to detect and encode switch closure. Each switch member has four sides adapted to be connected together. The first and second sides of all switch members within a column of the array are connected to a unique pair of a plurality of column connection terminals and the third and fourth sides of all switch members within a row of the array are connected to unique pair of a plurality of row connection terminals.

3 Claims, 9 Drawing Figures

PRIOR ART

| COLUMN No. | TERMINAL CODE |
|---|---|
| 0 | 111100 |
| 1 | 111010 |
| 2 | 110110 |
| 3 | 101110 |
| 4 | 011110 |
| 5 | 111001 |
| 6 | 110101 |
| 7 | 101101 |
| 8 | 011101 |
| 9 | 110011 |
| 10 | 101011 |
| 11 | 011011 |
| 12 | 100111 |
| 13 | 010111 |

*Fig. 6A.*

| ROW No. | TERMINAL CODE |
|---|---|
| 0 | 11111100 |
| 1 | 11111010 |
| 2 | 11110110 |
| 3 | 11101110 |
| 4 | 11011110 |
| 5 | 10111110 |
| 6 | 01111110 |
| 7 | 11111001 |
| 8 | 11110101 |
| 9 | 11101101 |
| 10 | 11011101 |
| 11 | 10111101 |
| 12 | 01111101 |
| 13 | 11110011 |
| 14 | 11101011 |
| 15 | 11011011 |
| 16 | 10111011 |
| 17 | 01111011 |
| 18 | 11100111 |
| 19 | 11010111 |
| 20 | 10110111 |
| 21 | 01110111 |
| 22 | 11001111 |
| 23 | 10101111 |
| 24 | 01101111 |
| 25 | 10011111 |
| 26 | 01011111 |
| 27 | 00111111 |

DUAL ENCODED SWITCHING MATRIX

DESCRIPTION

This is a continuation-in-part of the co-pending application Ser. No. 030,502, filed on Apr. 16, 1979, now abandoned.

BACKGROUND OF THE INVENTION

This invention relates to the detection of switch closure in an array of switches and, more particularly, to an arrangement for minimizing the number of connections needed between an array of switches and the circuit used to detect and encode switch closure.

Input switch arrangements for keyboards are conventionally constructed of a substantially rectangular array of switches formed into a matrix where the product of the number of rows and the number of columns is the total number of switches in the matrix and the sum of the number of rows and the number of columns is the number of connections needed. A single switch element is provided at the intersection of each column and each row which, when operated, connects the respective column with the respective row. Switch closure is conventionally detected by putting a known voltage on a column (or row) and then sequentially examining each row (or column) to determine if there is a connection. This is repeated for all the columns (or rows) in the matrix.

While effective, the aforedescribed arrangement is disadvantageous because, for example, a relatively large number of connections are required (the sum of the number of columns and the number of rows) and a relatively long scan time is needed, especially for a large matrix. The first of these disadvantages is particularly acute when utilizing integrated circuits because of the limited number of terminals available on an integrated circuit chip.

It is therefore an object of this invention to provide an input switch arrangement which overcomes the above stated disadvantages.

It is a further object of this invention to provide an input switch arrangement which minimizes the number of connections required between the input switches and the switch closure detection and encoding circuitry.

It is another object of this invention to provide an input switch arrangement which minimizes the amount of time required for detecting the identity of the closed switch in an array of switches.

SUMMARY OF THE INVENTION

The foregoing and additional objects are attained in accordance with the principles of this invention by providing a plurality of switch members arranged in a rectangular array of columns and rows. Each of the switch members is positioned at the intersection of a respective column and row of the array and has a first side, a second side, a third side and a fourth side adapted to be selectively connected together. A first plurality of terminals is provided along with means for connecting the first side of all of the switch members within one of the columns to one of the first plurality of terminals and the second side of all of the switch members within that one of the columns to a different one of the first plurality of terminals so that the switch members within each column are connected to a unique pair of the first plurality of terminals and the number C of columns and the number M of the first plurality of terminals satisfy the relationship $$\frac{(M-1)(M-2)}{2} < C \leq \frac{M(M-1)}{2}.$$

A second plurality of terminals is also provided along with means for connecting the third side of all of the switch members within one of the rows to one of the second plurality of terminals and the fourth side of all of the switch members within that one of the rows to a different one of the second plurality of terminals so that the switch members within each row are connected to a unique pair of the second plurality of terminals and the number R of rows and the number N of the second plurality of terminals satisfy the relationship $$\frac{(N-1)(N-2)}{2} < R \leq \frac{N(N-1)}{2}.$$

BRIEF DESCRIPTION OF THE DRAWINGS

The foregoing will be more readily apparent upon reading the following description in conjunction with the drawing in which.

DETAILED DESCRIPTION

Figures 1, 2:
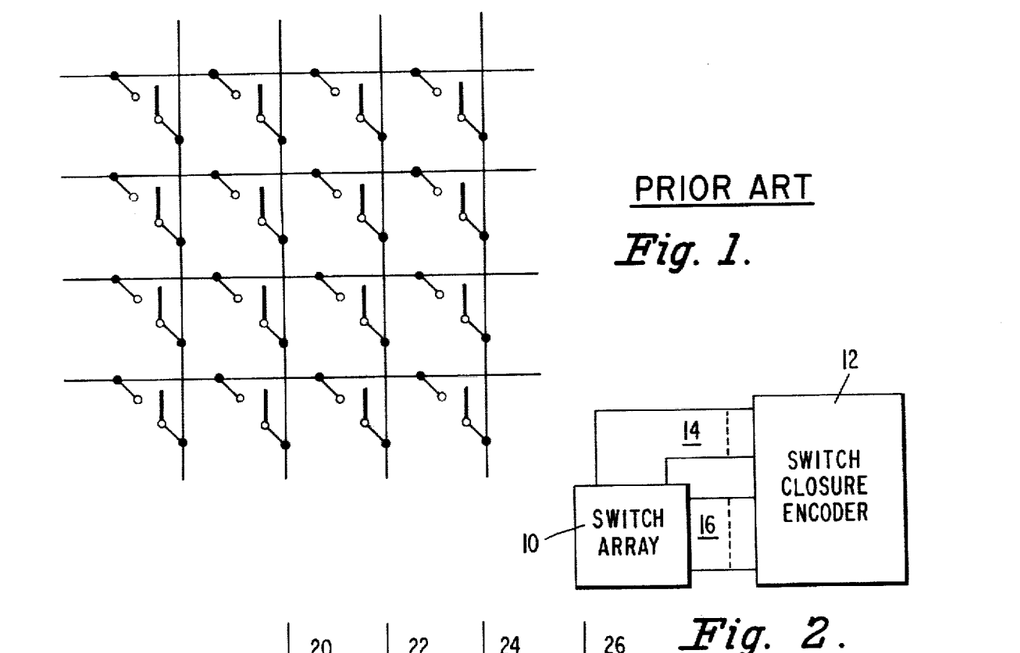
FIG. 1 illustrates a conventional prior art matrix type input switch arrangement.
FIG. 2 is a general block diagram of a switch array connected to a switch closure encoder.

FIG. 1 shows sixteen input switches arranged in a conventional prior art four by four matrix. A single switch element is provided at the intersection of each column and each row of the matrix. When a switch is closed, a connection is provided between the column and row leads corresponding to that switch. FIG. 2 generally illustrates the connection of a switch array 10 to a switch closure encoder 12. In such an arrangement, the switch closure encoder is connected to the switch array 10 via the column leads 14 and the row leads 16. When the switch array 10 is of the prior art matrix type shown in FIG. 1, switch closure is typically detected by placing a known voltage on one of the column (or row) leads and then sequentially examining each row (or column) lead to determine if there is a connection at any of those intersections. This is repeated for all the column (or row) leads in the matrix. Thus, for sixteen switch elements arranged as shown in FIG. 1, eight leads (four column leads and four row leads) and at least four interrogations are required for switch closure encoding.

The input switch arrangement constructed in accordance with the principles of this invention utilizes the known relationship that the number P of unique pairs that can be arranged from a set of N elements is provided by the following equation:

$$P = N(N-1)/2.$$

Figure 3:
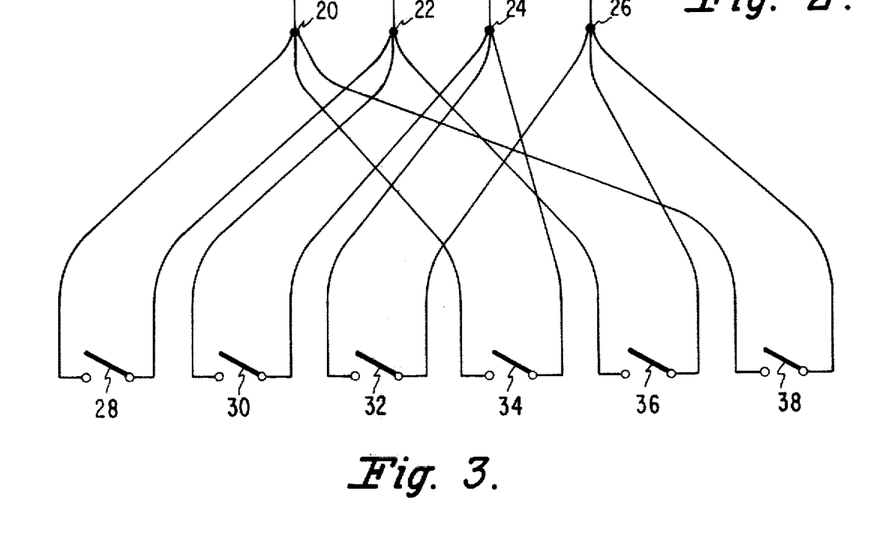
FIG. 3 is a simplified diagram of switch connections useful in understanding the principles of this invention.

This means that, by properly connecting leads from an array of switches, $N(N-1)/2$ switches can be encoded using N connection terminals. For example, if $N=6$, then fifteen switches could be encoded using six connection terminals. The matrix method illustrated in FIG. 1 would require eight leads. In order to take advantage of this relationship, both sides of each switch element must be available for connection. FIG. 3 illustrates how the four terminals 20, 22, 24 and 26 may be connected to the six switches 28, 30, 32, 34, 36 and 38 to uniquely determine the closure thereof. From FIG. 3 it is seen that the switch 28 is connected to the terminals 20 and 22 and is the only one of the six switches connected to that pair of terminals. It is noted that five terminals would be needed to determine switch closure were the switches to be arranged in a matrix form, rather than the four terminals in the arrangement shown in FIG. 3.

Figure 4:
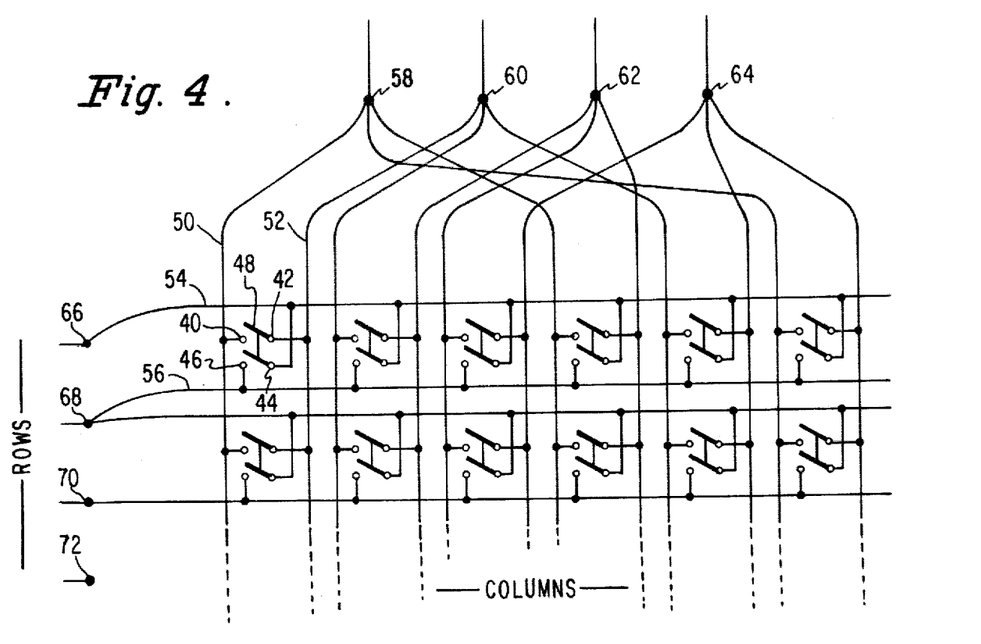
FIG. 4 schematically illustrates an input switch arrangement constructed in accordance with the principles of this invention.

FIG. 4 schematically illustrates an input switch arrangement constructed in accordance with the principles of this invention. As shown therein, the input switch arrangement is in matrix form with six columns. While only two rows are shown in detail, it is understood that the illustrated array could have any desired number of rows. At the intersection of each column and row is a switch member. Each switch member has a first side 40, a second side 42, a third side 44 and a fourth side 46. For illustrative purposes, the switch member is shown as having a movable contact arm 48 which is adapted to connect together all four sides 40–46 of the switch member. The first and second sides 40, 42 of all of the switch members within the leftmost column are connected to a pair of leads 50, 52. Similarly, the third and fourth sides 44, 46 of all of the switch members within the upper row are connected to a pair of leads 54, 56.

As shown in FIG. 4, a first plurality of terminals 58, 60, 62 and 64 are provided for connection to the column leads of the matrix. The first side of all of the switch members within a given one of the columns is connected to one of the first plurality of terminals 58–64 and the second side of all of the switch members within that column is connected to a different one of that first plurality of terminals 58–64 so that the switch members within each column are connected to a unique pair of the first plurality of terminals 58–64. To minimize the number of connection terminals, the number C of columns and the number M of column connection terminals satisfy the relationship $$\frac{(M-1)(M-2)}{2} < C \leq \frac{M(M-1)}{2}.$$

Likewise, a second plurality of terminals 66, 68, 70 and 72 are provided for connection to the row leads of the matrix. The third side of all of the switch members within a given one of the rows is connected to one of the second plurality of terminals 66–72 and the fourth side of all of the switch members within that row is connected to a different one of the plurality of terminals 66–72 so that the switch members within each row are connected to a unique pair of the second plurality of terminals 66–72. To minimize the number of connection terminals, the number R of rows and the number N of row connection terminals satisfy the relationship $$\frac{(N-1)(N-2)}{2} < R \leq \frac{N(N-1)}{2}.$$

Figure 5:
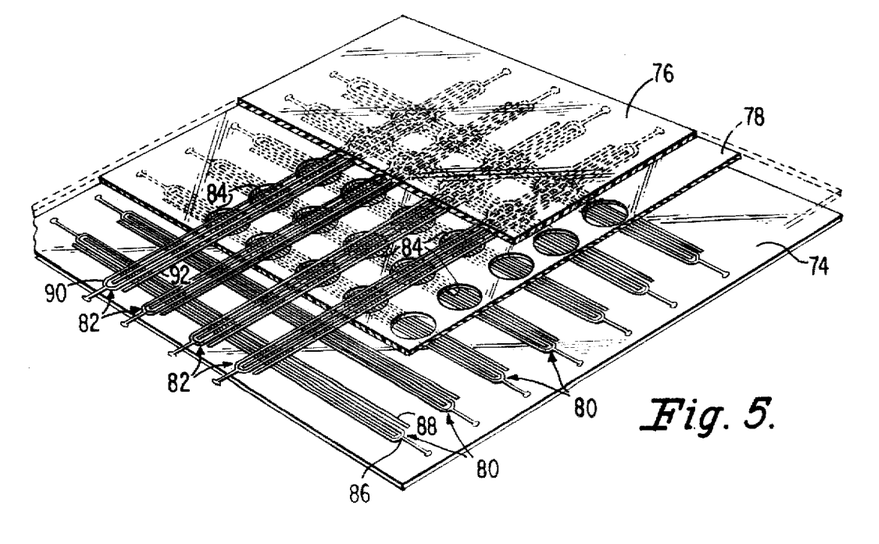
FIG. 5 is a partially cut away perspective view of an input switch arrangement constructed in accordance with the principles of this invention.

FIG. 5 illustrates the structure of an input switch arrangement which may advantageously be utilized in practicing this invention. The input switch arrangement is fabricated using a pair of printed circuit substrates 74, 76, separated by an insulating sheet 78. The lower sheet 74 is preferably rigid and the upper sheet 76 is preferably flexible. Several sets of conductive strips 80 is equally spaced parallel rows are supported on the printed circuit substrate 76. The sets of conductive strips 80 on the printed circuit substrate 74 face upwardly and the sets of conductive strips 82 on the printed circuit substrate 76 face downwardly. The sets of conductive strips 80 and 82 are in substantially perpendicular relation to each other. The insulating sheet 78 separates the sets of conductive strips 80, 82 and is formed with a plurality of apertures 84 arranged equally distant from each other in rows and columns such that each column of the apertures 84 overlies a set of conductive strips 80 and each row of the apertures 84 underlies a set of conductive strips 82.

Each set of conductive strips 80 on the printed circuit substrate 74 includes two conductors 86, 88 is spaced parallel relation. These conductors 86, 88 correspond to the first and second sides of the switch members within a column of the input switching arrangement. Likewise, each of the sets of conductive strips 82 on the printed circuit substrate 76 includes two conductors 90, 92 in spaced parallel relation which correspond to the third and fourth sides of each of the switch members within a row of the input switch arrangement. Although not shown in FIG. 4, the upper surface of the printed circuit substrate 76 is marked to indicate the intersection points of the sets of conductive strips 80, 82. These intersection points are aligned with the apertures 84 in the insulating sheet 78. Thus, when pressure is applied at an appropriate intersection point marked on the printed circuit substrate 76, since the printed circuit substrate 76 is flexible, it will be deflected through the corresponding aperture 84 and a connection will be made between all four sides of the switch member at the intersection point, i.e., the two column conductors and the two row conductors for that intersection will all be connected together. The connections of the strips 86, 88, 90 and 92 to their respective column and row connection terminals is in the manner described above with respect to FIG. 4.

It is noted that each of the conductive strips 86–92 is actually constructed as two connected and spaced-apart strips interleaved with the two strips of its parallel column or row counterpart. Although this is not necessary, it is preferable to insure proper contact of the column and row conductors.

To determine switch closure of an input switching array of the type illustrated in FIGS. 4 and 5, an arrangement is provided for applying a known voltage, for example ground, on all the column connection terminals and all the row connection terminals are examined. The known voltage appears on a unique pair of row connection terminals. The procedure is then repeated by placing the known voltage on all the row connection terminals and then examining the column connection terminals. The known voltage appears on a unique pair of the column connection terminals. Thus, only two readings are required to determine switch closure, independent of the size of the input switching array.

Figure 6A:
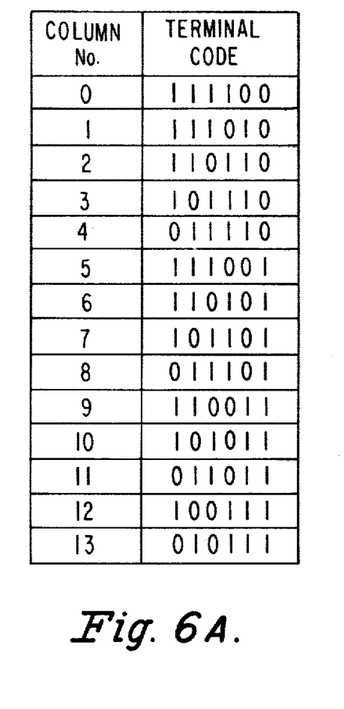
FIGS. 6A and 6B are tables of illustrative coding illustrating the connections of a large input switch arrangement constructed in accordance with the principles of this invention.
Figure 6B:
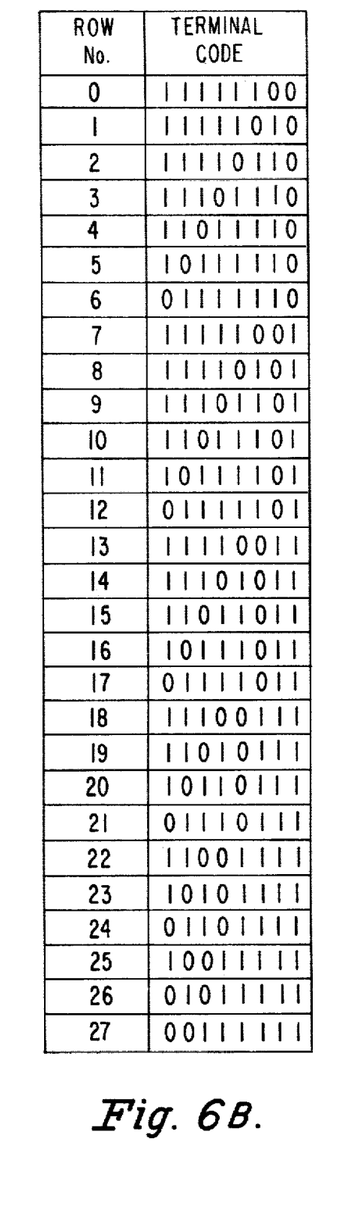

In an illustrative arrangement, an input switch arrangement was constructed having 14 columns and 28 rows, for a total of 392 individual switch members. A conventional matrix approach would require 14+28=42 leads to connect this many switches to an encoding circuit. With the arrangement according to the present invention, 8 leads are used to decode the 28 rows and 6 leads are used to decode the 14 columns, for a total of 14 leads. An illustrative coding for the 14 columns is shown in FIG. 6A and an illustrative coding for the 28 rows is shown in FIG. 6B. In these tables, for each column (or row) the ZEROS in the terminal code indicate which of the respective connection terminals are connected to the two sides of the switch members within that column (or row).

Figures 7, 8:
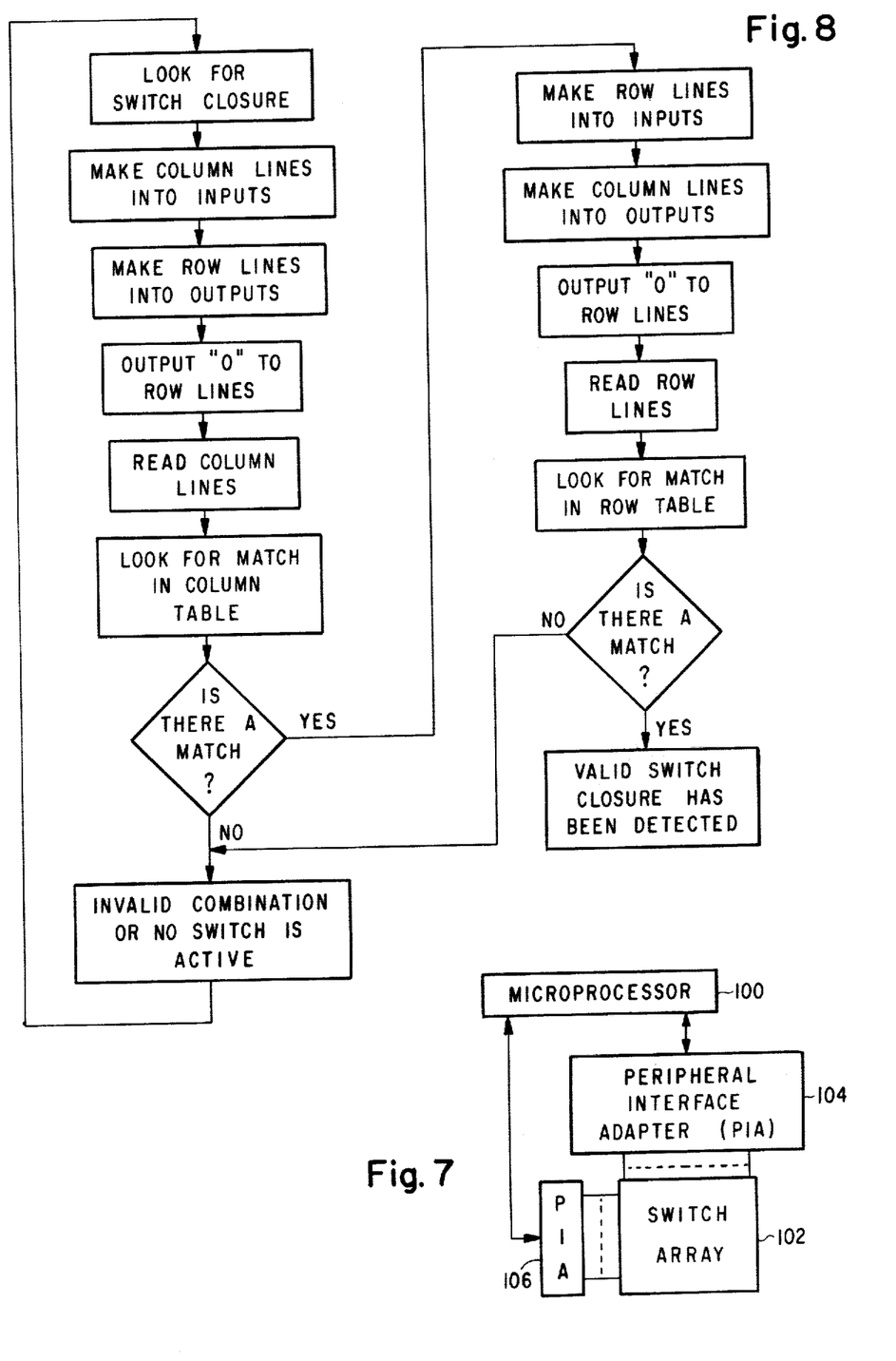
FIG. 7 is a general block diagram illustrating an input switch arrangement constructed in accordance with this invention connected to a microprocessor programmed to detect switch closure.
FIG. 8 is a flow chart of an illustrative subroutine which may be utilized by the microprocessor shown in FIG. 7 for detecting switch closure.

FIG. 7 illustrates an arrangement whereby a microprocessor 100 is utilized to detect switch closure of a switch array 102 constructed in accordance with the principles of this invention. Illustratively, the microprocessor 100 is a type 6502 microprocessor manufactured by MOS Technology of Norris, Pa. The microprocessor 100 is connected to the column connection terminals of the switch array 102 through a peripheral interface adapter (PIA) 104, illustratively a type 6520 PIA manufactured by MOS Technology of Norris, Pa. The microprocessor 100 is connected to the row connection terminal of the switch array 102 through a peripheral interface adapter (PIA) 106, illustratively also a type 6520 PIA, manufactured by MOS Technology of Norris, Pa. The microprocessor 100 is appropriately programmed to apply ground to all the column connection terminals and examine all the row connection terminals and then to apply ground to all the row connection terminals and examine the column connection terminals, with the tables of FIGS. 6A and 6B being stored within the memory of the microprocessor 100 for determining switch closure. The Appendix to this specification illustrates a subroutine for the microprocessor 100 for determining switch closure of the array 102. The subroutine set forth in the Appendix operates in accordance with the flow chart illustrated in FIG. 8.

Thus, the microprocessor 100 controls the PIA 104 to make the column lines into inputs and controls the PIA 106 to make the row lines into outputs. The PIA 106 is then caused to ground all the row connection terminals of the array 102 and the inputs to the PIA 104 are compared against the keyboard column codes (FIG. 6A) stored in the memory of the microprocessor 100 to determine in which column is the switch closure. The process is continued for the rows by controlling the PIA 106 to make the row lines into inputs and controlling the PIA 104 to make the column lines into outputs. This is followed by applying grounds to the column connection terminals of the switch array 102 through the PIA 104 and comparing the inputs to the PIA 106 with the keyboard row codes (FIG. 6B) stored in the memory of the microprocessor 100 to determine in which of the rows of the switch array 102 there has been a closure.

Accordingly, there has been disclosed an arrangement for minimizing the number of connections needed between an array of switches and the circuit used to detect and encode switch closure. It is understood that the above-described embodiment is merely illustrative of the application of the principles of this invention. Numerous other embodiments may be devised by those skilled in the art without departing from the spirit and scope of this invention, as defined by the appended claims.

APPENDIX

| LABEL | INSTR. | MODIFIER | COMMENTS |
|---|---|---|---|
| | | | IRQ ROUTINE READS KEYBOARD AND STORES COLUMN AND ROW VALUES IF NECESSARY |
| IRQINT | PHA | | SAVE REGISTERS |
| | TXA | | |
| | PHA | | |
| | TYA | | |
| | PHA | | |
| | LDA | TOUCHF WAS A VALID TOUCH MADE LAST TIME? | |
| | BEQ | CHECKK | NO, READ KEYBOARD |
| | JMP | NOLOW | YES, SEE IF USER IS NO LONGER TOUCHING |
| CHECKK | LDA | #0 | SET UP FOR READING ROW LINES |
| | STA | FCR | |
| | STA | BCR | |
| | STA | DATAF | SET ROW LINES TO INPUTS |
| | LDA | #$FF | |
| | STA | DATAB | SET COLUMN LINES TO OUTPUTS |
| | LDA | #4 | |
| | STA | FCR | |
| | STA | BCR | |
| | READ KEYBOARD ROW LINES | | |
| | LDY | #5 | |
| | LDA | DATAB | |
| | AND | #$C0 | ZERO THE COLUMN LINES |
| | STA | DATAB | |
| READ | LDA | DATAF | READ ROW DATA LINES |

APPENDIX-continued

| LABEL | INSTR. | MODIFIER | COMMENTS |
|---|---|---|---|
| | STA | TEMP | |
| CKRD | LDA | DATAF | |
| | CMP | TEMP | |
| | BNE | READ | RE-READ UNTIL READING IS STABLE |
| | DEY | | |
| | BPL | CKRD | READ UNTIL GET SIX STABLE READINGS |
| | CMP | #$FF | IF ALL ROW LINES HIGH, NO READING |
| | BEQ | NTOUCH | |
| | STA | FEED | SAVE READING IN FEED |
| | LDX | #27 | |
| VALID | LDA | TABLEF,X | |
| | CMP | FEED | LOOK FOR MATCHING ENTRY IN TABLEF |
| | BEQ | SETB | |
| | DEX | | |
| | BMI | NTOUCH | CAN'T FIND MATCH; RETURN |
| | JMP | VALID | |

NOTHING BEING PRESSED OR INVALID COMBINATION OF LINES; SO RETURN

| LABEL | INSTR. | MODIFIER | COMMENTS |
|---|---|---|---|
| NTOUCH | LDA | #$FF | |
| | STA | LSTFED | INDICATE NO ROW OR COLUMN THIS TIME |
| | STA | LSTBIT | |
| RETTCH | LDA | #200 | |
| | STA | CLK8T | RESET TIMER |
| | PLA | | RESTORE REGISTERS |
| | TAY | | |
| | PLA | | |
| | TAX | | |
| | PLA | | |
| | RTI | | |
| SETB | STX | FEED | X = INDEX TO VALUE IN TABLEF WHICH MATCHES READING (X = #OF LINE BEING PRESSED) |
| | LDA | #0 | SET UP FOR READING COLUMN LINES |
| | STA | FCR | |
| | STA | BCR | |
| | LDA | #$C0 | |
| | STA | DATAB | SET COLUMN LINES TO INPUTS |
| | LDA | #$FF | |
| | STA | DATAF | SET ROW LINES TO OUTPUTS |
| | LDA | #4 | |
| | STA | FCR | |
| | STA | BCR | |

READ KEYBOARD COLUMN LINES

| LABEL | INSTR. | MODIFIER | COMMENTS |
|---|---|---|---|
| | LDA | #0 | |
| | STA | DATAF | ZERO THE ROW LINES |
| | LDY | #5 | |
| READ1 | LDA | DATAB | |
| | ASL | A | MASK OFF JUNK |
| | ASL | A | |
| | STA | TEMP | |
| CKRD1 | LDA | DATAB | |
| | ASL | A | |
| | ASL | A | |
| | CMP | TEMP | |
| | BNE | READ 1 | RE-READ UNTIL READING IS STABLE |
| | DEY | | |
| | BPL | CKRD1 | READ UNTIL GET SIX STABLE READINGS |
| | LSR | A | |
| | LSR | A | |
| | STA | BIGHT | SAVE READING |
| | LDX | #13 | |
| VALIDB | LDA | TABLEB,X | LOOK FOR MATCHING ENTRY IN TABLEB |
| | CMP | BIGHT | |
| | BEQ | GOOD | |
| | DEX | | |
| | BMI | NTOUCH | CAN'T FIND MATCH; RETURN |
| | JMP | VALIDB | |
| GOOD | STX | BIGHT | |

A ROW & COLUMN HAVE BEEN TOUCHED. SEE IF THE SAME ROW & COLUMN WAS TOUCHED LAST TIME. YOU MUST SELECT A ROW & COLUMN TWO IRQ'S IN A ROW FOR IT TO BE VALID.

| LABEL | INSTR. | MODIFIER | COMMENTS |
|---|---|---|---|
| | LDA | LSTBIT | A HAS LAST COLUMN VALUE |
| | LDY | LSTFED | Y HAS LAST ROW VALUE |
| | STX | LSTBIT | SAVE CURRENT COLUMN |
| | LDX | FEED | |
| | STX | LSTFED | SAVE CURRENT ROW |
| | CPY | LSTFED | |

APPENDIX-continued

| LABEL | INSTR. | MODIFIER | COMMENTS |
|---|---|---|---|
| | BNE | RETTCH | CURRENT ROW TOUCH NOT SAME AS LAST TIME |
| | CMP | LSTBIT | |
| | BNE | RETTCH | |
| ROW & COLUMN READINGS ARE SAME AS LAST TIME: VALID READING | | | |
| | LDA | #$FF | |
| | STA | TOUCHF | SET TOUCHF |
| DETERMINE GRID (INTERSECTION OF A ROW LINE & A COLUMN LINE) | | | |
| UNSTAK | LDA | #200 | |
| | STA | CLK8T | |
| | PLA | | |
| | TAY | | |
| | PLA | | |
| | TAX | | |
| | PLA | | |
| | RTI | | |
| A VALID SWITCH WAS PRESSED LAST TIME. SEE IF A SWITCH IS NO LONGER BEING PRESSED. | | | |
| NOLOW | LDA | DATAB | IS A SWITCH PRESSED? |
| | AND | #$3F | MASK OFF JUNK |
| | CMP | #$3F | |
| | BNE | SWPRES | A SWITCH IS STILL BEING PRESSED |
| | LDA | #0 | |
| | STA | TOUCHF | NO SWITCH IS PRESSED, CLEAR FLAG |
| | LDA | #$FF | |
| | STA | LSTFED | INDICATE NO VALID ROW OR COLUMN LAST TIME |
| | STA | LSTBIT | |
| SWPRES | JMP | UNSTAK | |
| KEYBOARD ROW CODES | | | |
| TABLEF | .BYTE $FC | | ROW 0 |
| | .BYTE $FA | | ROW 1 |
| | .BYTE $F6 | | ROW 2 |
| | .BYTE $EE | | ROW 3 |
| | .BYTE $DE | | ROW 4 |
| | .BYTE $BE | | ROW 5 |
| | .BYTE $7E | | ROW 6 |
| | .BYTE $F9 | | ROW 7 |
| | .BYTE $F5 | | ROW 8 |
| | .BYTE $ED | | ROW 9 |
| | .BYTE $0D | | ROW 10 |
| | .BYTE $BD | | ROW 11 |
| | .BYTE $7D | | ROW 12 |
| | .BYTE $F3 | | ROW 13 |
| | .BYTE $EB | | ROW 14 |
| | .BYTE $DB | | ROW 15 |
| | .BYTE $BB | | ROW 16 |
| | .BYTE $7B | | ROW 17 |
| | .BYTE $E7 | | ROW 18 |
| | .BYTE $D7 | | ROW 19 |
| | .BYTE $B7 | | ROW 20 |
| | .BYTE $77 | | ROW 21 |
| | .BYTE $CF | | ROW 22 |
| | .BYTE $AF | | ROW 23 |
| | .BYTE $6F | | ROW 24 |
| | .BYTE $9F | | ROW 25 |
| | .BYTE $5F | | ROW 26 |
| | .BYTE $3F | | ROW 27 |
| KEYBOARD COLUMN CODES | | | |
| TABLEB | .BYTE $3C | | COLUMN 0 |
| | .BYTE $3A | | COLUMN 1 |
| | .BYTE $36 | | COLUMN 2 |
| | .BYTE $2E | | COLUMN 3 |
| | .BYTE $1E | | COLUMN 4 |
| | .BYTE $39 | | COLUMN 5 |
| | .BYTE $35 | | COLUMN 6 |
| | .BYTE $2D | | COLUMN 7 |
| | .BYTE $1D | | COLUMN 8 |
| | .BYTE $33 | | COLUMN 9 |
| | .BYTE $2B | | COLUMN 10 |
| | .BYTE $1B | | COLUMN 11 |
| | .BYTE $27 | | COLUMN 12 |
| | .BYTE $17 | | COLUMN 13 |

I claim:

1. An input switch arrangement comprising:

a plurality of switch members arranged in a rectangular array of columns and rows, each of said switch members being positioned at the intersection of a respective column and row of said array, each of said switch members having a first side, a second side, a third side and a fourth side adapted to be selectively connected together;

a first plurality of terminals;

a second plurality of terminals;

means for connecting the first side of all the switch members within a one of the columns to one of said first plurality of terminals and the second side of all of the switch members within said one of the columns to a different one of said first plurality of terminals so that the switch members within each column are connected to a unique pair of said first plurality of terminals and wherein the number C of columns and the number M of said first plurality of terminals satisfy the relationship $$\frac{(M-1)(M-2)}{2} < C \leq \frac{M(M-1)}{2} ;$$

and means for connecting the third side of all of the switch members within a one of the rows to one of said second plurality of terminals and the fourth side of all of the switch members within said one of the rows to a different one of said second plurality of terminals so that the switch members within each row are connected to a unique pair of said second plurality of terminals and wherein the number R of rows and the number N of said second plurality of terminals satisfy the relationship $$\frac{(N-1)(N-2)}{2} < R \leq \frac{N(N-1)}{2} .$$

2. The input switch arrangement according to claim 1 further including means connected to said first and second pluralities of terminals for detecting switch closure comprising:

means for applying a first voltage to said first plurality of terminals;

means for examining said second plurality of terminals to determine which of said second plurality of terminals has said first voltage thereon;

means for applying a second voltage to said second plurality of terminals; and means for examining said first plurality of terminals to determine which of said first plurality of terminals has said second voltage thereon.

3. The input switch arrangement according to claim 1 or 2 wherein said plurality of switch members comprises:

a first printed circuit substrate having thereon a plurality of spaced apart parallel sets of pairs of parallel conductors;

a second printed circuit substrate having thereon a plurality of spaced apart parallel sets of pairs of parallel conductors, said first and second printed circuit substrates being arranged with respect to each other so that the conductors of one are substantially perpendicular and in facing relationship to the conductors of the other; and an insulating sheet interposed between said first and second printed circuit substrates, said insulating sheet having apertures therein aligned with the intersections between the sets of pairs of conductors on said first and second printed circuit substrates;

wherein the first and second sides of all the switch members within a one of the columns are formed from a one of the sets of pairs of parallel conductors in one of said first or second printed circuit substrates and the third and fourth sides of all the switch members within a one of the rows are formed from a one of the sets of pairs of parallel conductors on the other of said first or second printed circuit substrates.

* * * * *